(12) United States Patent
Aquilino et al.

(10) Patent No.: US 10,971,625 B2
(45) Date of Patent: Apr. 6, 2021

(54) EPITAXIAL STRUCTURES OF A SEMICONDUCTOR DEVICE HAVING A WIDE GATE PITCH

(71) Applicant: GLOBALFOUNDRIES U.S. INC., Santa Clara, CA (US)

(72) Inventors: Michael V Aquilino, Gansevoort, NY (US); Daniel Jaeger, Saratoga Springs, NY (US); Man Gu, Malta, NY (US); Bradley Morgenfeld, Greenfield Center, NY (US); Haiting Wang, Clifton Park, NY (US); Kavya Sree Duggimpudi, Clifton Park, NY (US); Wang Zheng, Ballston Lake, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/458,178

(22) Filed: Jun. 30, 2019

(65) Prior Publication Data
US 2020/0411689 A1 Dec. 31, 2020

(51) Int. Cl.
*H01L 29/08* (2006.01)
*H01L 27/112* (2006.01)
*H01L 29/78* (2006.01)
*H01L 21/822* (2006.01)
*H01L 29/66* (2006.01)

(52) U.S. Cl.
CPC ...... *H01L 29/7842* (2013.01); *H01L 21/8221* (2013.01); *H01L 27/1122* (2013.01); *H01L 29/0843* (2013.01); *H01L 29/66613* (2013.01)

(58) Field of Classification Search
CPC .......... H01L 29/7842; H01L 29/66613; H01L 21/8221; H01L 29/4232; H01L 29/66704; H01L 29/0843; H01L 29/41725; H01L 21/772; H01L 2924/14; H01L 39/2458; H01L 27/02; H01L 27/1122; H01L 27/11807; H01L 27/0922
See application file for complete search history.

(56) References Cited

U.S. PATENT DOCUMENTS

| | | | |
|---|---|---|---|
| 7,892,931 B2 | 2/2011 | Sridhar et al. | |
| 2007/0096149 A1* | 5/2007 | Liu | H01L 21/823807 257/192 |
| 2008/0237741 A1 | 10/2008 | Ranade et al. | |
| 2011/0278671 A1* | 11/2011 | Lin | H01L 29/41725 257/337 |
| 2015/0333148 A1* | 11/2015 | Koo | H01L 27/1104 257/288 |

* cited by examiner

*Primary Examiner* — Galina G Yushina
(74) *Attorney, Agent, or Firm* — David Cain

(57) ABSTRACT

A semiconductor device is provided, which includes an array of active regions, gate stacks and substantially uniform epitaxial structures. The gate stacks of the array include a first gate stack and a second gate stack over an active region. An active pillar between the first gate stack and the second gate stack, and the active pillar separating two substantially uniform epitaxial structures. A contact structure over the active pillar, positioned equidistant from the first gate stack and the second gate stack.

18 Claims, 5 Drawing Sheets

EPITAXIAL STRUCTURES OF A SEMICONDUCTOR DEVICE HAVING A WIDE GATE PITCH

FIELD OF THE INVENTION

The disclosed subject matter relates generally to semiconductor devices, and more particularly to a method of forming substantially uniform epitaxial structures for a semiconductor device having a wide gate pitch and the resulting semiconductor devices.

BACKGROUND

The global market for radio frequency (RF) semiconductor devices is growing at an exponential rate. There is an increasing demand from industries such as telecommunications, radar systems and computer networks to provide reliable and high speed connectivity. The typical operating frequency of RF semiconductor devices ranges from 3 kHz to 300 GHz.

RF semiconductor devices, specifically the field effect transistor (FET) devices for RF applications, are required to handle high speed switching of high power RF signals. Presence of parasitic components in RF semiconductor devices, such as parasitic inductance, capacitance, conductance and resistance, may combine to attenuate and degrade the RF signals considerably. RF signal losses are more significant at a higher operating frequency, and it is critical to ensure the RF signal losses are kept low, or at least at an acceptable level for a specific application.

One of the present solutions is to fabricate RF FET devices in a wide gate pitch region, enabling the contact structures to be positioned far apart from gate structures in order to reduce parasitic capacitance. However, forming epitaxial structures in a region of wide gate pitch is challenging due to an inherent pattern loading effect. The pattern loading effect pertains to a phenomenon occurring during the simultaneous epitaxial growth in a region of a higher pattern density and a region of a lower pattern density.

As a result of a difference in growth rates of the epitaxial structures in these regions, the amount of epitaxial material grown can differ, and this causes non-uniformity in thicknesses and composition of resulting epitaxial structures. For example, a higher pattern density area with smaller areas for epitaxial growth may have a higher growth rate than that of a lower pattern density area. Furthermore, the composition of the epitaxial structures at high pattern density areas may be different from those epitaxial structures at low pattern density areas. The non-uniformity of epitaxial structures in terms of layer thicknesses and composition may adversely affect the RF FET device performance.

As described above, a method of forming substantially uniform epitaxial structures for a semiconductor device having a wide gate pitch and the resulting semiconductor devices are presented

SUMMARY

To achieve the foregoing and other aspects of the present disclosure, a method of forming substantially uniform epitaxial structures for a semiconductor device having a wide gate pitch and the resulting semiconductor devices are presented.

According to an aspect of the disclosure, a semiconductor device is provided, which includes an array of active regions, gate stacks and substantially uniform epitaxial structures. The gate stacks of the array include a first gate stack and a second gate stack over an active region. An active pillar between the first gate stack and the second gate stack, and the active pillar separating two substantially uniform epitaxial structures. A contact structure over the active pillar, positioned equidistant from the first gate stack and the second gate stack.

According to another aspect of the disclosure, a method of forming a semiconductor device is provided, which includes providing an active region over a substrate, the active region having a top surface. A first gate stack and a second gate stack are formed over the active region. An active pillar is formed in the active region between the first gate stack and the second gate stack, the active pillar having a top surface substantially coplanar with the top surface of the active region. Substantially uniform epitaxial structures are formed positioned adjacent to the active pillar in the active region. A contact structure is formed over the active pillar.

According to yet another aspect of the disclosure, a method of forming a semiconductor device is provided, a method of forming a semiconductor device is provided, which includes providing an active region over a substrate, the active region having a top surface. A first gate stack and a second gate stack are formed over the active region. An active pillar is formed below the top surface of the active region between the first gate stack and the second gate stack. Substantially uniform epitaxial structures are formed adjacent to the active pillar in the active region. A dielectric layer is deposited over the epitaxial structures, the active pillar, the first gate stack and the second gate stack. A contact opening is formed in the dielectric layer over the active pillar, the contact opening having a width at least as wide as the active pillar. The contact opening is filled with a conductive material to form a contact structure is formed over the active pillar.

BRIEF DESCRIPTION OF THE DRAWINGS

The embodiments of the present disclosure will be better understood from a reading of the following detailed description, taken in conjunction with the accompanying drawings.

Figure 1:
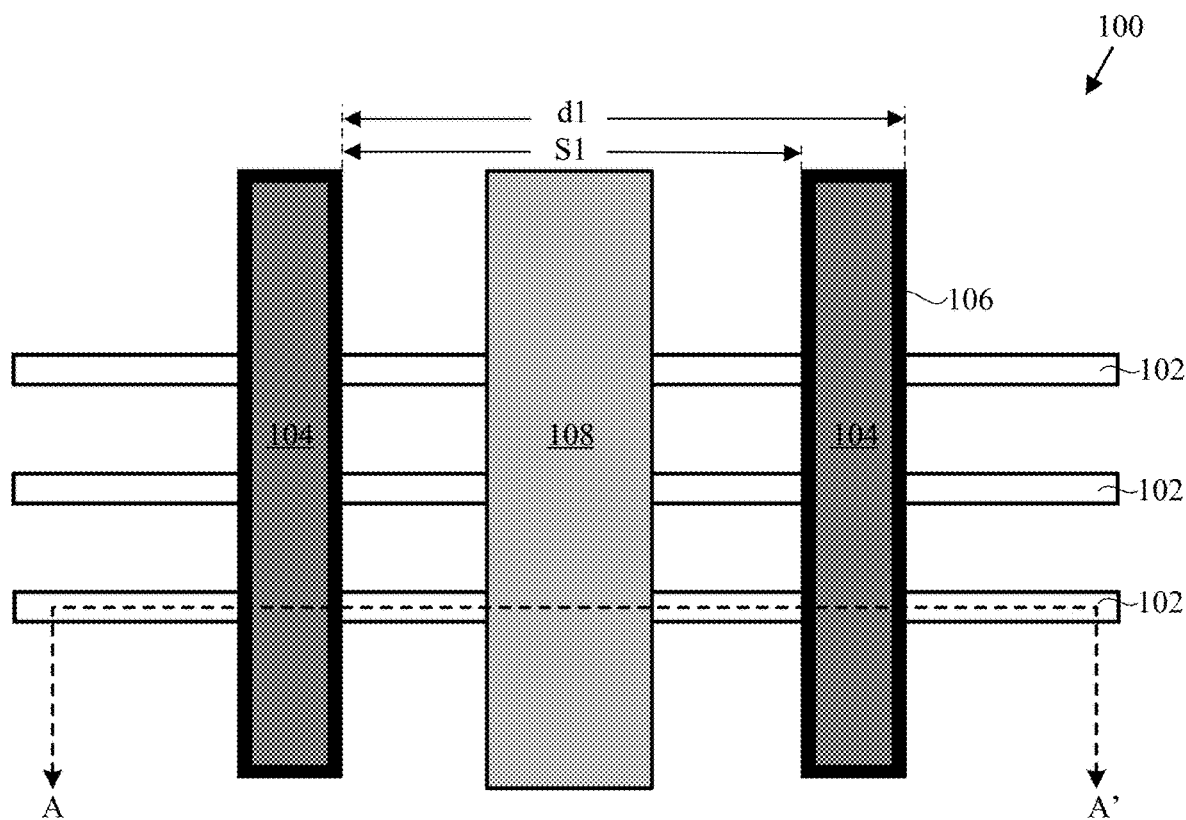
FIG. 1 is a simplified top view of a semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure. Additionally, elements in the drawings are not necessarily drawn to scale. For example, the dimensions of some of the elements in the drawings may be exaggerated relative to other elements to help improve understanding of embodiments of the disclosure. The same reference numerals in different drawings denote the same elements, while similar reference numerals may, but do not necessarily, denote similar elements.

DETAILED DESCRIPTION

Various embodiments of the disclosure are described below. The embodiments disclosed herein are exemplary and not intended to be exhaustive or limiting to the disclosure.

The disclosure relates to a method of forming substantially uniform epitaxial structures for a semiconductor device having a wide gate pitch. The semiconductor device may be complementary metal-oxide-semiconductor (CMOS) devices including P-type metal-oxide-semiconductor (PMOS) devices and/or N-type metal-oxide-semiconductor (NMOS) devices. It is understood that the following disclosure is not limited to any particular type of semiconductor devices. The method disclosed herein may be applied to any type of semiconductor devices, such as tri-gate field effect transistor (FET) devices, fin-type FET (FinFET) devices or planar-type metal-oxide-semiconductor FET (MOSFET) devices.

The semiconductor device may be fabricated with a gate-first, a gate-last or a hybrid fabrication process. In a gate-first process, conductive layers are formed over active regions and patterned to form gate structures. This is followed by conventional CMOS processing, including formation of source and drain regions, formation of gate spacers and deposition of inter-level dielectric (ILD) material. In a gate-last process, dummy gate structures are formed followed by conventional CMOS processing including formation of the source and drain regions, formation of gate spacers and deposition of ILD material. Thereafter, the dummy gate structures are removed followed by conventional formation of replacement gate structures. In the hybrid fabrication process, a gate structure of one type of device may be formed first and a gate structure of another type of device may be formed last.

The term "gate pitch" as used herein defines a distance from a left edge of a gate structure to a left edge of an adjacent gate structure. The minimum gate pitch in a semiconductor device is termed "contacted poly pitch" (CPP), with a corresponding minimum gate-to-gate spacing. The term "gate spacing" as used herein defines a distance between two adjacent gate structures. The term "wide gate pitch" as used herein defines a gate pitch wider than 1×CPP of the semiconductor device, i.e., 1.5×CPP, 2×CPP or greater.

Embodiments of the disclosure are now described in detail with accompanying drawings. It is noted that like and corresponding elements are referred to by the use of the same reference numerals. However, it is noted that specific elements may be denoted by a reference numeral and a subscript, for example 206a, 206b, etc. When those elements are referred to generically, merely the reference numerals are used, for example 206, 216, etc.

FIG. 1 is a simplified top view of a semiconductor device 100, according to an embodiment of the disclosure. The semiconductor device 100 includes an array of active regions 102 and gate structures 104 traversing across the array of active regions 102. Sidewalls of the gate structures 104 are disposed with gate spacers 106. The gate structures 104 (and their respective gate spacers 106) are separated by a gate pitch d1 with a corresponding gate-to-gate spacing S1 between adjacent gate structures 104 (with their respective gate spacers 106). A contact structure 108 traverses across the active regions 102 between the gate structures 104.

In this embodiment, the gate pitch d1 is preferable to have a width wider than 1×CPP of the semiconductor device 100. For example, the gate pitch d1 may have a width of 1.5×CPP, 2×CPP or greater. It is understood that there are other gate structures having the minimum gate pitch of 1×CPP formed on different regions of the semiconductor device, although those gate structures are not shown in the accompanying drawings. The local pattern density at the region illustrated in FIG. 1 is of a lower pattern density than at regions having the minimum gate pitch of 1×CPP.

Those skilled in the art would recognize that the number and placement locations of the active regions 102 and the gate structures 104 may vary according to the specific designs of the semiconductor devices.

Furthermore, while the active regions 102 are represented as fins in the accompanying drawings, it is also understood that the fin is used only as a non-limiting example of the active region, and other active regions (e.g., a doped layer on a top surface of a bulk semiconductor substrate or a semiconductor-on-insulator layer) may be used as well.

Figure 2:
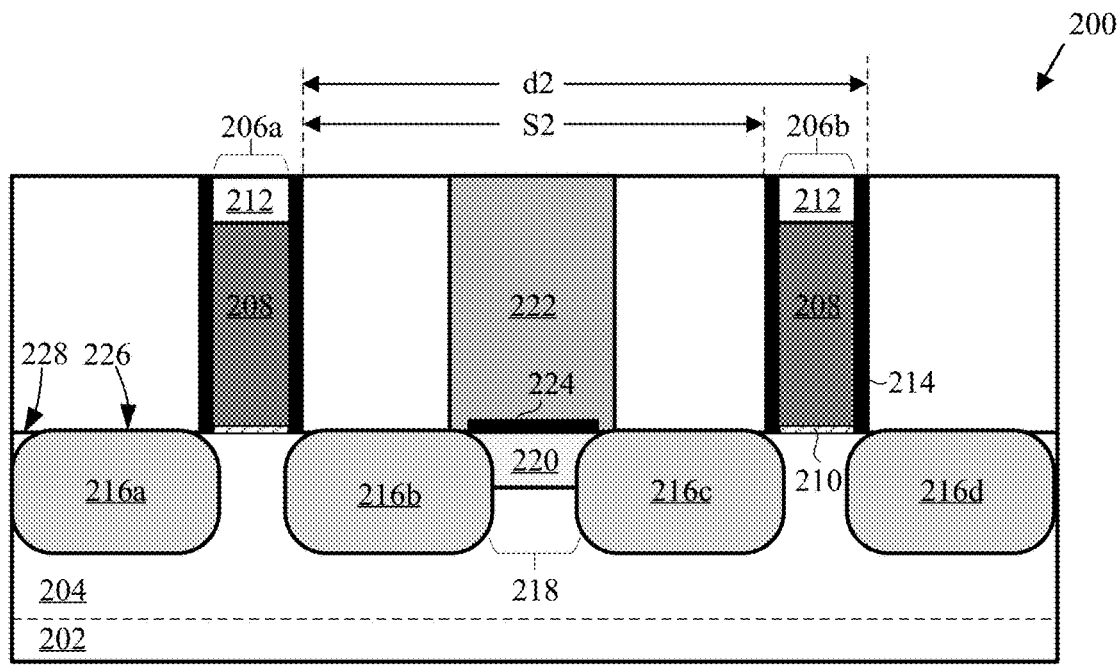
FIG. 2 is a cross-sectional view of a semiconductor device, according to an embodiment of the disclosure.

FIG. 2 is a cross-sectional view of a semiconductor device 200 (taken along a similar line A-A' as indicated in FIG. 1), according to an embodiment of the disclosure. The semiconductor device 200 includes a semiconductor substrate 202 and an active region 204 extending upwards from the substrate 202 (a dashed line has been arbitrarily demarcated to show an intersection between the substrate 202 and the active region 204). Gate stacks 206 are formed over the active region 204. Each gate stack 206 includes a dummy gate structure 208, a gate insulating layer 210, a gate cap 212, fabricated by a gate-last fabrication process. Sidewalls of the gate stacks 206 are disposed with gate spacers 214. The gate stacks 206 transverse across the active region 204, as illustrated in FIG. 1. The gate stacks 206 are separated by a gate pitch d2 with a corresponding gate-to-gate spacing S2 between adjacent gate stacks 206.

The dummy gate structure 208 may be formed of a sacrificial material (e.g., amorphous silicon). In an alternative embodiment of the disclosure, the gate stacks 206 include a metal gate structure fabricated by a gate-first fabrication process. The gate spacers 214 may be formed of a low-k dielectric material, i.e., a dielectric material having a low dielectric constant, to at least contribute to electrically isolate the gate stack 206 from adjacent conductive structures. The gate spacers 214 may include silicon nitride, silicon oxide or other suitable low-k dielectric material having any suitable thickness.

As illustrated in FIG. 2, each of the gate stacks 206 is positioned between a pair of substantially uniform epitaxial structures 216. Specifically, the gate stack 206a is positioned between the epitaxial structures (216a and 216b, respectively), and the gate stack 206b is positioned between the epitaxial structures (216c and 216d, respectively). In some embodiments, the epitaxial structures 216 have top surfaces 226 that are substantially coplanar with a top surface 228 of the active region 204. The epitaxial structures (216b and 216c, respectively) are separated by an active pillar 218 formed below the top surface 228 of the active region 204. A conductive region 220 is formed at an upper portion of the active pillar 218 to electrically connect the epitaxial structures (216b and 216c, respectively). The conductive region 220 may be formed by implanting the upper portion of the active pillar 218 with dopants, using a suitable implantation process with any suitable dopants of any suitable dopant concentration.

A contact structure 222 is formed over the active pillar 218, between the gate stacks and contacting the epitaxial structures (216b and 216c, respectively). The contact structure 222 has a width at least as wide as the active pillar 218 and provides electrical contact between the epitaxial structures (216b and 216c, respectively) and the other portions of the semiconductor device 200. As illustrated in FIG. 2, a dielectric segment 224 is present over the active pillar 218. The size of the contact structure 222 may be adjusted such that the contact structure 222 contacts the epitaxial structures (216b and 216c, respectively) adjacent to the active pillar 218.

It should be appreciated that design consideration of the contact structure 222 needs to be carefully optimized and balanced between the width of the contact structure 222 and the associated parasitic capacitance acceptance level, as the parasitic capacitance increases with decreasing distance between the contact structure 222 and the gate stacks 206. The dielectric segment 224 may be removed during the fabrication process according to an alternative embodiment of the disclosure.

Although not shown in FIG. 2, the contact structure 222 may include one or more liners. For instance, the contact structure may include an adhesion liner and/or a barrier liner. The adhesion liner may include metal silicides, such as titanium silicide, nickel silicide or other suitable adhesion material having any suitable thickness. The barrier liner may include metal nitrides, such as titanium nitride, tantalum nitride or other suitable barrier material having any suitable thickness.

The contact structure 222 is preferably positioned equidistant from the gate stacks (206a and 206b, respectively), forming a distance as far apart as possible between the contact structure 222 and the gate stacks 206. Positioning the contact structure 222 away from the gate stacks 206 reduces parasitic capacitance between the contact structure 222 and the gate stacks 206, which is especially desirable for RF applications. Decreased parasitic capacitance increases switching speed and lower signal losses of high power RF signals when the semiconductor device is operating at a high frequency.

FIGS. 3A-3H are cross-sectional views of a partially processed semiconductor device 300, illustrating a method of fabricating the semiconductor device 200 in FIG. 2, according to embodiments of the disclosure.

Figure 3A:
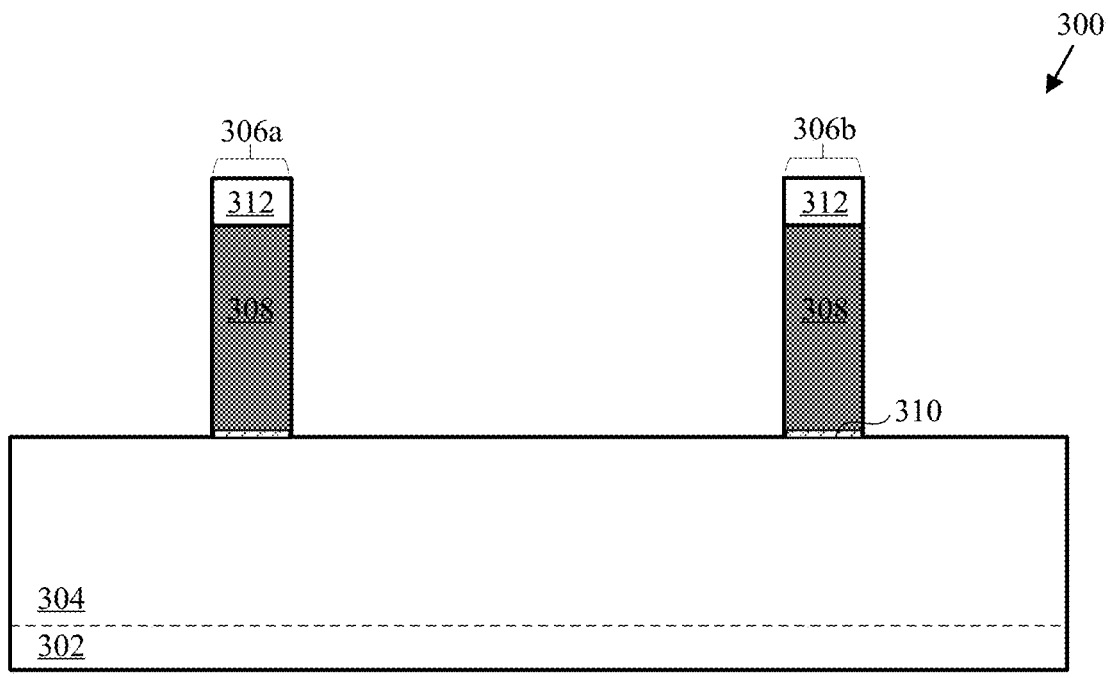
FIGS. 3A-3H are cross-sectional views of a partially processed semiconductor device (taken along a line A-A' as indicated in FIG. 1), illustrating a method of forming substantially uniform epitaxial structures for a semiconductor device having a wide gate pitch, according to an embodiment of the disclosure.

FIG. 3A is a cross-sectional view of the semiconductor device 300, including a semiconductor substrate 302 and an active region 304 extending upwards from the substrate 302 (a dashed line has been arbitrarily demarcated to show an intersection between the substrate 302 and the active region 304). Gate stacks 306 are formed over the active region 304. Each gate stack 306 includes a dummy gate structure 308, a gate insulating layer 310 and a gate cap 312, fabricated by a gate-last fabrication process. The dummy gate structure 308 may be formed of a sacrificial material (e.g., amorphous silicon). In an alternative embodiment of the disclosure, the gate stacks 306 include a metal gate structure fabricated by a gate-first fabrication process.

The semiconductor substrate 302 may include of any appropriate semiconductor material, such as silicon, silicon germanium, silicon carbon, other II-VI or III-V semiconductor compounds and the like. In one embodiment of the disclosure, the semiconductor material of the substrate 302 is preferably silicon.

Figure 3B:
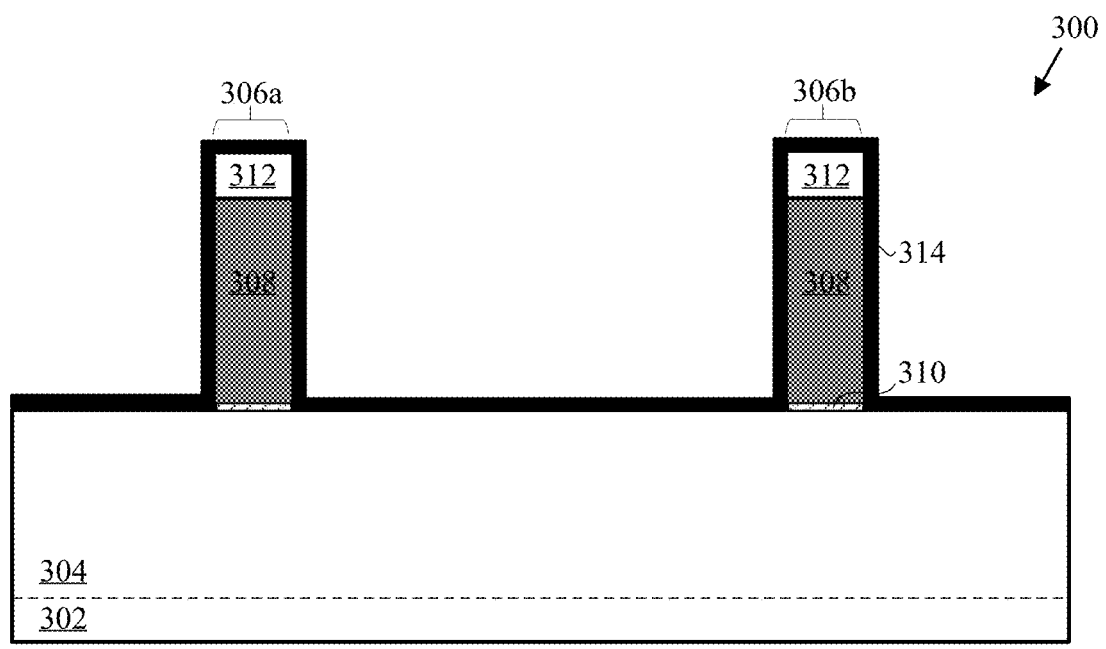

FIG. 3B illustrates the semiconductor device 300 after depositing a dielectric layer 314 over the gate stacks 306 and the active region 304, according to an embodiment of the disclosure. The dielectric layer 314 is deposited using a suitable deposition process. The dielectric layer 314 may be formed of a low-k dielectric material (i.e., a dielectric material having a low dielectric constant). The dielectric layer 314 may include silicon nitride, or other low-k dielectric material having any suitable thickness.

Figure 3C:
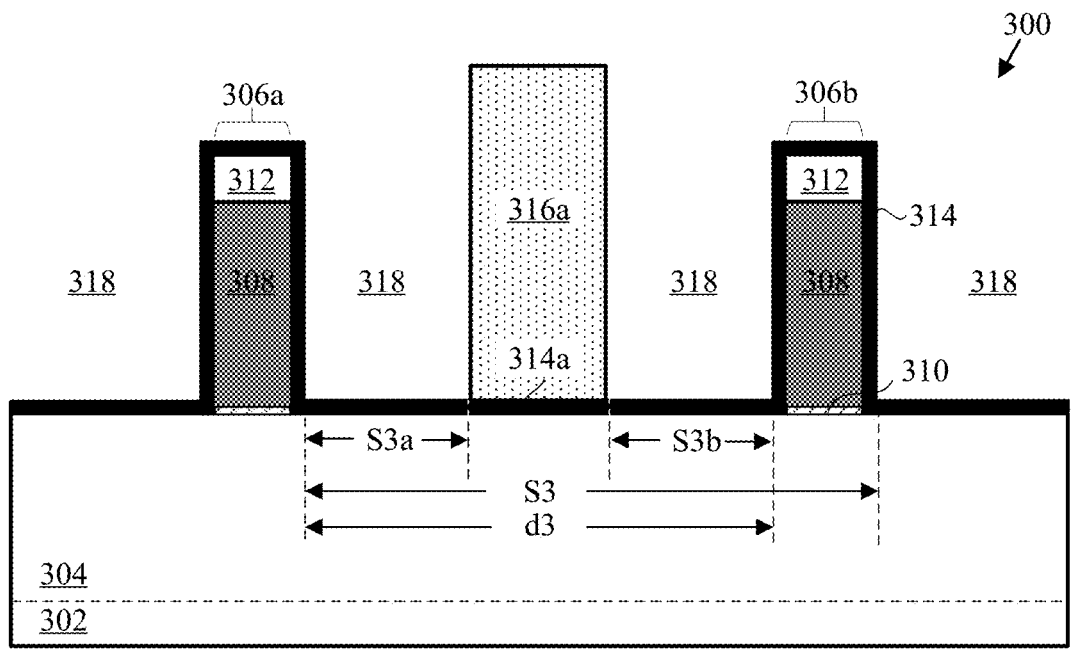

FIG. 3C illustrates the semiconductor device 300 after depositing a patterning layer 316 and forming openings 318 in the patterning layer 316, according to an embodiment of the disclosure. The patterning layer 316 is deposited over the dielectric layer 314 and the openings 318 are formed in the patterning layer 316 using suitable deposition and lithographic processes. A pillar mask 316a of the patterning layer 316 is selectively covering a portion of the dielectric layer 314a between the gate stacks 306. The patterning layer 316 may include a spin-on hard mask (SOH) layer, a photoresist layer, or any suitable patterning layer having any suitable thickness. The patterning layer 316 may also include a multi-layer stack of patterning materials.

Conventionally, the patterning layer 316 exposes a region, e.g., PMOS device region, on the semiconductor device 300 and serves as a protection layer for the other regions, e.g., NMOS device region, of the semiconductor device 300. Instead of exposing the entire PMOS device region, the lithographic mask can be modified to further include the pillar mask 316a to selectively cover the portions of the PMOS device region, i.e., portions of the dielectric layer between the gate stacks for the PMOS device. No new lithographic mask is necessary to selectively cover the portion of dielectric layer 314.

In this embodiment of the disclosure, the gate stack 306a and the pillar mask 316a, as illustrated in FIG. 3C, is separated by a gate-to-patterning layer spacing S3a, and the pillar mask 316a and the gate stack 306b is separated by a patterning layer-to-gate spacing S3b. The gate-to-patterning layer spacing S3a and the patterning layer-to-gate spacing S3b have a width substantially equal to the minimum gate-to-gate spacing of the semiconductor device 300.

It will be appreciated by those skilled in the art that the width of the pillar mask 316a may be adjusted to a predetermined width to form the openings 318 in the patterning layer 316 having a width substantially equal to the minimum gate-to-gate spacing of the semiconductor device 300. Although not shown, more than two openings 318 in the patterning layer 316 may be formed between the gate stack 306a and the gate stack 306b for the semiconductor device 300 if the gate pitch d3 has a wider width of at least than 2×CPP.

Figure 3D:
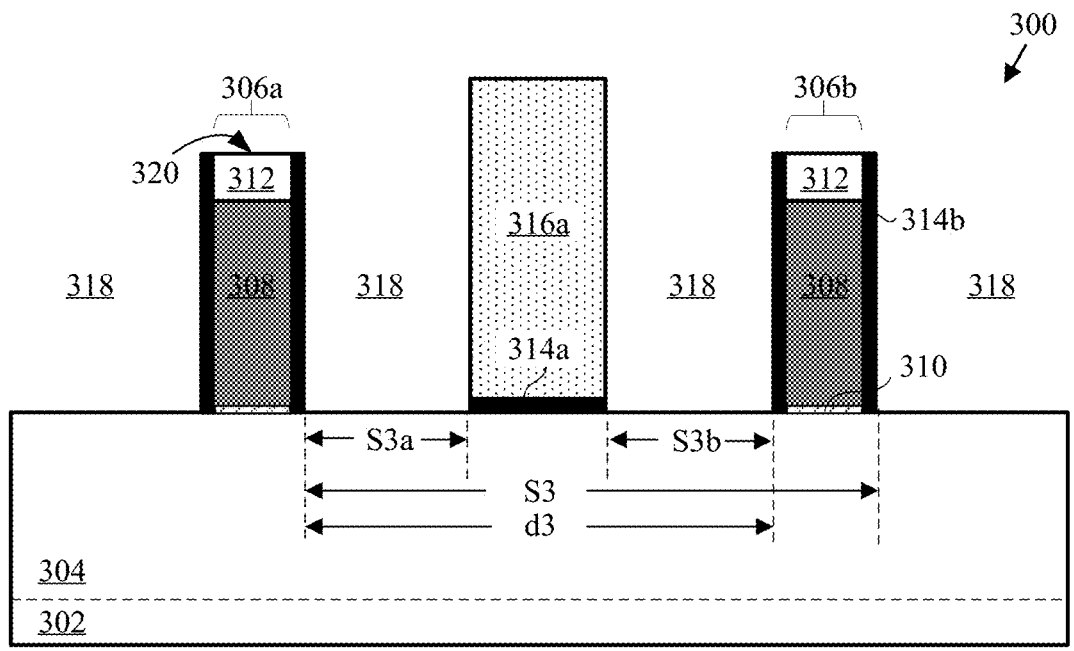

FIG. 3D illustrates the semiconductor device 300 after selectively removing the exposed portions of dielectric layer 314, according to an embodiment of the disclosure. A suitable material removing process is employed and a dielectric segment 314a is formed on the active region 304 between the gate stacks 306. The dielectric segment 314a, which is covered by the pillar mask 316a in FIG. 3C, has a width substantially equal to the width of the pillar mask 316a. The dielectric layer 314 over top surfaces 320 of the gate stacks 306 are also likewise removed in the material removing process, with portions of the dielectric layer 314b remaining on the sidewalls of the gate stacks 306, forming the gate spacers. Portions of the active region 304 are exposed, each portion having a width substantially equals to the minimum gate-to-gate spacing of the semiconductor device 300. In one embodiment of the disclosure, the suitable material removing process is a dry etching process.

Figure 3E:
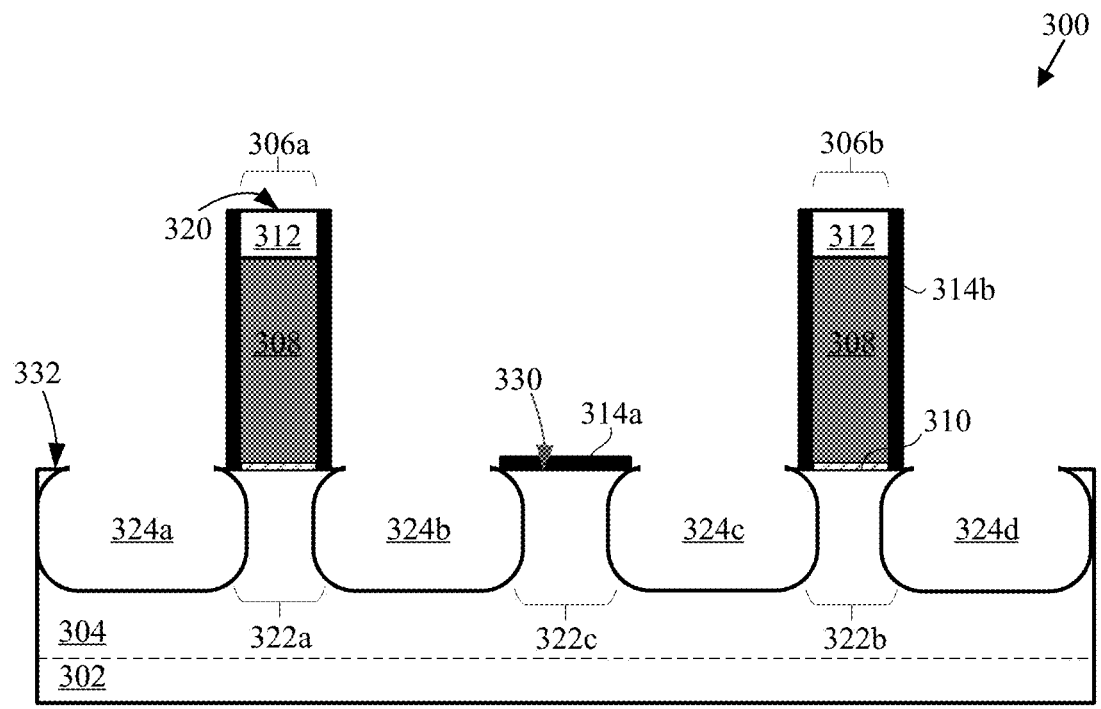

FIG. 3E illustrates the semiconductor device 300 after forming active pillars 322 in the active region 304, according to an embodiment of the disclosure. Using the gate stacks 306 and the pillar mask 316a as masking features, the active pillars 322 are formed below a top surface 332 of the active region 304 by removing material from the active region 304 using a suitable material removing process. The active pillar 322a is formed under the gate stack 306a, the active pillar 322b is formed under the gate stack 306b and the active pillar 322c is formed between the active pillars (322a and 322c, respectively). The active pillar 322c has a top surface 330 substantially coplanar with the top surface 332 of the active region 304 and has a width substantially equal to the width of the dielectric segment 314a. Advantageously, the formation of the active pillar 322c between gate stacks 306 having a wide gate pitch provides additional surface planes in active region 304 for epitaxial material to grow, thus eliminate, or at least reduce, the pattern loading effect during the formation of the epitaxial structures. The pillar mask 316a of the patterning layer 316 may be removed after the material removing process.

Cavities 324 are formed in the active region 304 after removal of material from the active region 304. The cavities (324a and 324b, respectively) are formed on opposite sides of the active pillar 322a, the cavities (324b and 324c, respectively) are formed on opposite sides of the active pillar 322c and the cavities (324c and 324d, respectively) are formed on opposite sides of the active pillar 322b. The cavities 324 are substantially uniform in size and have a width substantially equal to the minimum gate-to-gate spacing of the semiconductor device 300. In one embodiment of the disclosure, the suitable material removing process is a dry etching process.

Figure 3F:
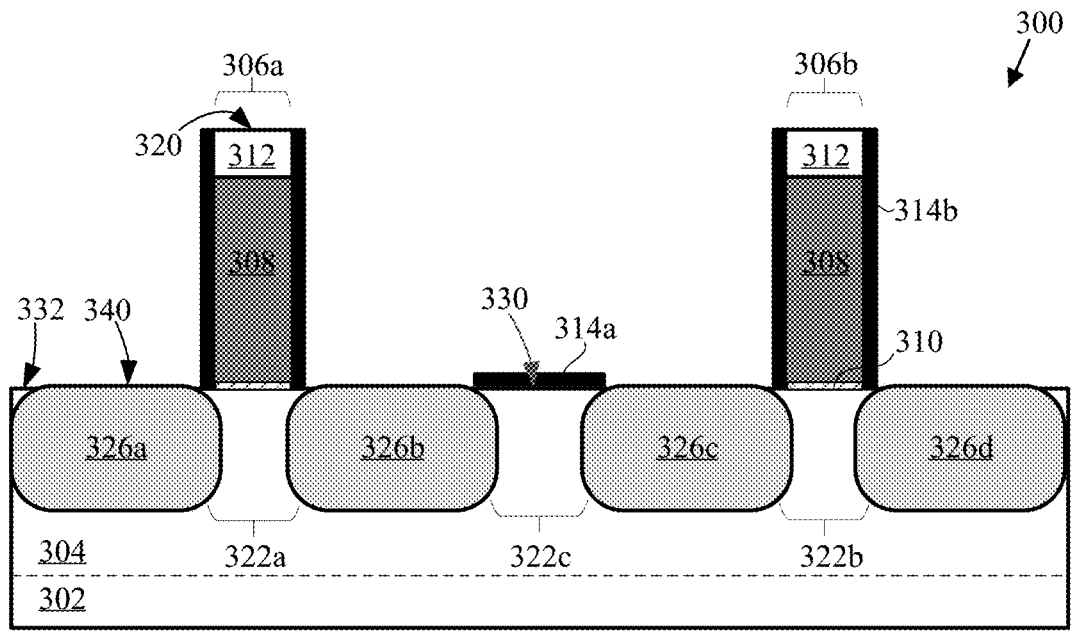

FIG. 3F illustrates the semiconductor device 300 after forming epitaxial structures 326 in the cavities 324, according to an embodiment of the disclosure. The semiconductor device 300 may be subjected to a suitable cleaning process prior to performing an epitaxy process. The cleaning process may be performed using a variety of etchants or cleaning agents, such as a dilute hydrofluoric acid. The cleaning process may remove any undesirable oxide material formed as a result of natural oxidation of exposed surfaces in the cavities 324.

The epitaxial structures 326 may be formed by growing an epitaxial material using a suitable epitaxy process, such as vapor-phase epitaxy process, liquid-phase epitaxy process or solid-phase epitaxy process. The epitaxial structures 326 may be grown selectively, i.e., the epitaxial growth only occurs over certain surfaces, such as over semiconductor surfaces in the cavities 324, while other surfaces remain substantially free of epitaxial material. Selective epitaxial growth has known techniques in the art.

Since the cavities 324 are substantially uniform in size, the pattern loading effect is significantly reduced and a similar amount of epitaxial material is grown in the cavities 324. The formed epitaxial structures 326 are expected to have similar geometric and compositional properties. Each of the epitaxial structures 326 has a top surface 340 substantially coplanar with the top surface 332 of the active region 304 and the top surface 330 of the active pillar 322c. Although FIG. 3F illustrates the dielectric segment 314a over the active pillar 322b, the dielectric segment 314a may be removed after the epitaxy process, according to an alternative embodiment of the disclosure.

The epitaxial material used to grow the epitaxial structures 326 may include silicon, silicon phosphorous, silicon phosphorous carbide, germanium, gallium arsenide, gallium nitride, aluminum gallium indium phosphide, and/or other suitable combinations. In one embodiment of the disclosure where an NMOS device is desired, the epitaxial structures 326 may include epitaxially-grown silicon. In another embodiment of the disclosure, where a PMOS device is desired, the epitaxial structures 326 may include epitaxially-grown silicon germanium.

The epitaxial structures 326 may be in-situ doped or undoped. In one embodiment of the disclosure, the epitaxial structures 326 may be doped with N-type donors during the epitaxy process to form NMOS device regions. The N-type donors may include phosphorus, arsenic, antimony, and/or other suitable dopants. In another embodiment of the disclosure, the epitaxial structures 326 may be doped with P-type acceptors during the epitaxy process to form PMOS device regions. The P-type acceptors may include boron, aluminum, gallium, indium, and/or other suitable dopants. One or more annealing processes may be performed to activate the PMOS and NMOS device regions. The annealing processes may include rapid thermal annealing (RTA) process, laser annealing process or other suitable annealing processes.

Additional process steps may be performed before, during or after forming the epitaxial structures. For example, when forming epitaxial structures in a PMOS device, one or more layers, such as patterning layers and dielectric layers may be formed on an NMOS device as protection layers by suitable deposition processes.

Figure 3G:
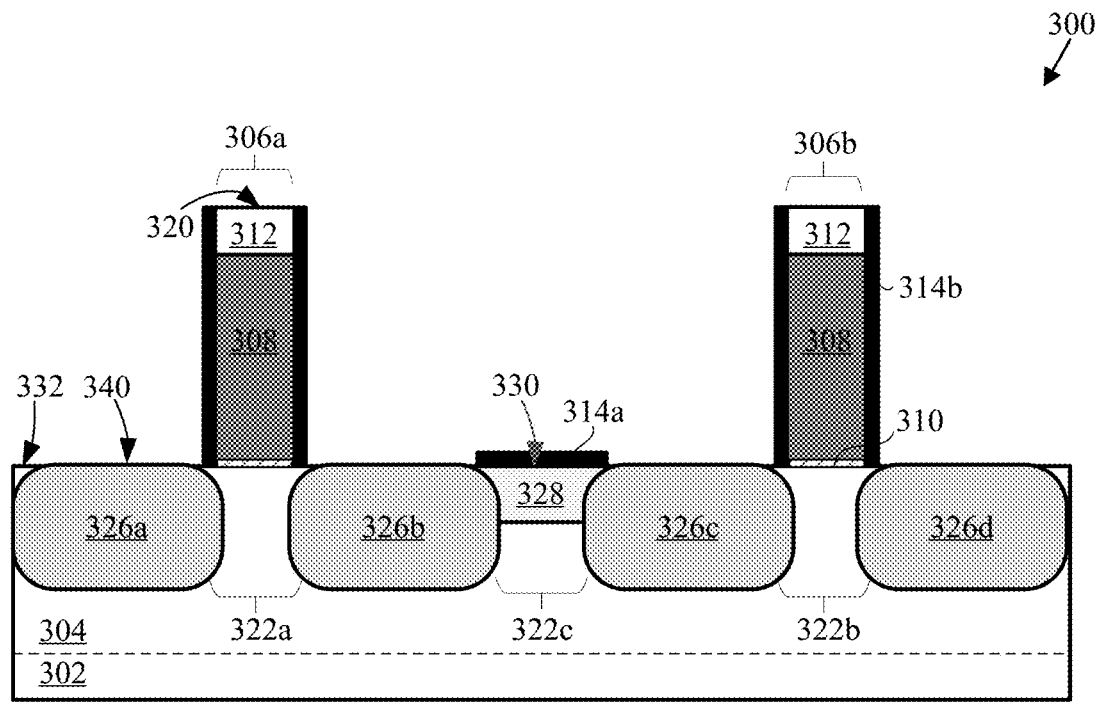

FIG. 3G illustrates the semiconductor device 300 after forming a conductive region 328 at an upper portion of the active pillar 322c, according to an embodiment of the disclosure. The conductive region 328 may be formed by performing a suitable implantation process at the active pillar 322c to connect the adjacent epitaxial structures (326b and 326c, respectively). Additional process steps are typically performed before the implantation process, such as forming one or more patterning layers and/or dielectric layers, as protection layers for regions that will not be implanted. The implantation process may use any suitable dopants having any suitable dopant concentration.

Figure 3H:
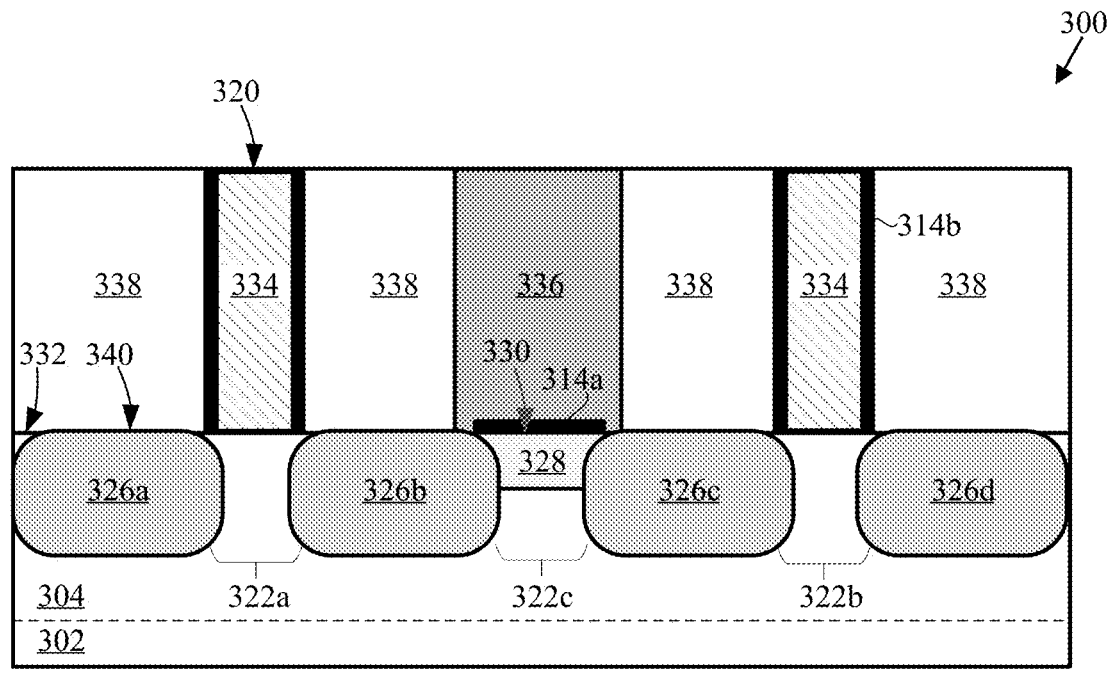

FIG. 3H illustrates the semiconductor device 300 after additional process steps have been performed to form replacement gate structures 334 and a contact structure 336, according to an embodiment of the disclosure. The processes may include one or more deposition process operations to form gate insulating layer/s (e.g., silicon dioxide, hafnium oxide, or a layer of high-k dielectric material having a dielectric constant of typically 10 or greater, etc.) and conductive layer/s (e.g., seed layers, work function layers or fill layers, etc.) that will be part of the gate electrode of the replacement gate structure 334. The gate insulating layers and the conductive layers are not separately shown in the accompanying drawings.

Similar to the semiconductor device 200 illustrated in FIG. 2, the contact structure 336 is formed over the active pillar 322c between the gate stacks 306 using known semiconductor fabrication processes, including an exemplary process described herein. An insulating layer 338 is deposited over the replacement gate structures 334 and the epitaxial structures 326 using a suitable deposition process. A contact opening (not shown) having a width at least as wide as the active pillar 322c is formed in the insulating layer 338 using suitable patterning processes. A conductive material is deposited in the contact opening using a suitable deposition process. The conductive material may include tungsten, copper, aluminum, alloys of these metals and/or combinations thereof. In this embodiment of the disclosure, the contact structure is preferably formed of tungsten. The conductive material may overfill the opening and a suitable planarization process may be performed to form a top surface substantially coplanar with a top surface of the dielectric layer. In one embodiment of the disclosure, the contact structure 336 may be formed before forming the replacement gate structures 334, as illustrated by FIG. 2.

Although not shown in FIG. 3H, one or more liners may be deposited during the formation of the contact structure 336. For instance, an adhesion liner and/or a barrier liner may be deposited in the contact opening before the conductive material deposition. The adhesion liner may include metal silicides, such as titanium silicide, nickel silicide or other suitable adhesion material having any suitable thickness. The barrier liner may include metal nitrides, such as titanium nitride, tantalum nitride or other suitable barrier material having any suitable thickness.

In the above detailed description, a method of growing substantially uniform epitaxial structures for a semiconductor device having a wide gate pitch is presented. At an active region having a lower local pattern density (e.g., a wide gate pitch region), an active pillar is formed between two adjacent gate stacks by removing material in the active region, forming cavities adjacent to the active pillar. The active pillar divides the active region into multiple smaller active regions, each smaller active region having a width substantially equal to the minimum gate-to-gate spacing of the semiconductor device. The active pillar creates additional surface planes in the active region and increases the local pattern density, enabling a substantially uniform growth of epitaxial structures in the cavities. The epitaxial structures formed are therefore substantially similar in geometric and compositional properties, minimizing the pattern loading effect of epitaxial growth. The substantially uniform epitaxial structures may be electrically connected by forming a conductive region at an upper portion of the active pillar.

A contact structure is formed over the active pillar. The contact structure is positioned such that the contact structure is equidistant from the gate stacks, reducing parasitic capacitance between the contact structure and the adjacent gate stack. Lowering parasitic capacitance in a semiconductor device is particularly advantageous for RF applications. Higher switching speed for high power RF devices with lower RF signal losses can be achieved when the semiconductor device is operating at a high frequency.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
   an array of active regions, gate stacks and substantially uniform epitaxial structures, the gate stacks including a first gate stack and a second gate stack over an active region, the second gate stack being adjacent to the first gate stack;
   an active pillar between the first gate stack and the second gate stack, wherein the active pillar comprises a doped conductive region;
   two substantially uniform epitaxial structures between the first and second gate stacks and are separated by the active pillar, wherein each of the substantially uniform epitaxial structures has a width substantially equal to a minimum gate-to-gate spacing of the semiconductor device; and
   a contact structure over the active pillar that is positioned equidistant from the first gate stack and the second gate stack.

2. The semiconductor device of claim 1, wherein the active pillar has a top surface substantially coplanar with a top surface of the active region.

3. The semiconductor device of claim 1, further comprises a dielectric segment over the active pillar.

4. The semiconductor device of claim 1, wherein the doped conductive region is at an upper portion of the active pillar.

5. The semiconductor device of claim 1, wherein the contact structure has a width at least as wide as the active pillar and electrically connects the two substantially uniform epitaxial structures.

6. The semiconductor device of claim 1, wherein each of the substantially uniform epitaxial structures has a top surface substantially coplanar with a top surface of the active pillar.

7. A method of forming a semiconductor device comprising:
   providing an active region over a substrate, the active region having a top surface;
   forming a first gate stack and a second gate stack over the active region, the second gate stack being adjacent to the first gate stack;
   forming an active pillar in the active region between the first gate stack and the second gate stack, wherein the active pillar has a top surface substantially coplanar with the top surface of the active region;
   forming a doped conductive region in the active pillar;
   forming substantially uniform epitaxial structures between the first and second gate stacks that are positioned adjacent to the active pillar in the active region, wherein each of the substantially uniform epitaxial structures has a width substantially equal to a minimum gate-to-gate spacing of the semiconductor device; and forming a contact structure over the active pillar.

8. The method of claim 7, wherein forming the active pillar further comprises:
depositing a dielectric layer over the active region, the first gate stack and the second gate stack;
forming openings in the dielectric layer to expose portions of the active region; and
removing the exposed portions of the active region to form the active pillar in the active region.

9. The method of claim 8, wherein removing the exposed portions of the active region further comprises using the first gate stack, the second gate stack and a pillar mask portion of the patterning layer interposed therebetween as masking features to form the active pillar.

10. The method of claim 9, wherein removing the exposed portions of the active region further comprises forming a first cavity between the first gate stack and the pillar mask and a second cavity between the pillar mask and the second gate stack; and
the substantially uniform epitaxial structures are formed in the first and second cavities adjacent to the active pillar and are formed with top surfaces that are substantially coplanar with the top surface of the active region.

11. The method of claim 10, wherein the first and second cavities are formed by a dry etching process.

12. The method of claim 7, wherein the active pillar has a pre-determined width that defines widths of the epitaxial structures to be substantially equal to a minimum gate-to-gate spacing of the semiconductor device.

13. The method of claim 7, wherein forming the doped conductive region comprises implanting the active pillar with dopants to electrically connect the substantially uniform epitaxial structures adjacent to the active pillar in the active region.

14. The method of claim 7, wherein forming the contact structure over the active pillar further comprises:
depositing an insulating layer over and between the first and second gate stacks;
forming a contact opening having a width at least as wide as the active pillar in the insulating layer; and
filling the contact opening with a conductive material to form the contact structure.

15. A semiconductor device comprising:
an active region;
a first gate stack and a second gate stack over the active region, the second gate stack being adjacent to the first gate stack;
an active pillar in the active region between the first gate stack and the second gate stack, wherein the active pillar comprises a doped conductive region;
two substantially uniform epitaxial structures separated by the active pillar between the first and second gate stacks, wherein each of the substantially uniform epitaxial structures has a width substantially equal to a minimum gate-to-gate spacing of the semiconductor device; and
a contact structure over the active pillar.

16. The semiconductor device of claim 15, wherein the contact structure is equidistant from the first gate stack and the second gate stack.

17. The semiconductor device of claim 15, wherein the contact structure electrically contacts the two substantially uniform epitaxial structures.

18. The semiconductor device of claim 15, wherein the contact structure has a width at least as wide as the active pillar.

* * * * *